United States Patent
Sekiguchi et al.

(10) Patent No.: US 10,103,047 B2
(45) Date of Patent: Oct. 16, 2018

(54) FLOW PATH MEMBER, HEAT EXCHANGER INCLUDING THE FLOW PATH MEMBER, AND SEMICONDUCTOR MANUFACTURING APPARATUS INCLUDING THE FLOW PATH MEMBER

(71) Applicant: KYOCERA Corporation, Kyoto-shi, Kyoto (JP)

(72) Inventors: Keiichi Sekiguchi, Satsumasendai (JP); Kazuhiko Fujio, Satsumasendai (JP); Yuusaku Ishimine, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 430 days.

(21) Appl. No.: 14/389,254

(22) PCT Filed: Mar. 28, 2013

(86) PCT No.: PCT/JP2013/059293
§ 371 (c)(1),
(2) Date: Sep. 29, 2014

(87) PCT Pub. No.: WO2013/147037
PCT Pub. Date: Oct. 3, 2013

(65) Prior Publication Data
US 2015/0084261 A1    Mar. 26, 2015

(30) Foreign Application Priority Data
Mar. 29, 2012  (JP) ................................ 2012-076851

(51) Int. Cl.
*F28F 7/00*        (2006.01)
*F28F 13/00*       (2006.01)
(Continued)

(52) U.S. Cl.
CPC ............ *H01L 21/6833* (2013.01); *F28F 3/12* (2013.01); *F28F 13/18* (2013.01); *F28F 21/04* (2013.01);
(Continued)

(58) Field of Classification Search
CPC ..... F28D 2021/0029; F28D 2021/0028; H01L 23/473; H01L 21/6833; H01L 21/67109;
(Continued)

(56) References Cited

U.S. PATENT DOCUMENTS 5,666,269 A * 9/1997 Romero ................ H01L 23/473
165/80.4
7,821,767 B2  10/2010 Fuji
(Continued)

FOREIGN PATENT DOCUMENTS

EP      0 938 126 A1   8/1999
JP      2001-257253 A  9/2001
(Continued)

OTHER PUBLICATIONS

Extended European Search Report dated Sep. 24, 2015 issued by the European Patent Office for Counterpart European Application No. 13767305.9.
(Continued)

*Primary Examiner* — Jason Thompson
(74) *Attorney, Agent, or Firm* — Procopio Cory Hargreaves and Savitch LLP (57) ABSTRACT

A flow path member includes a flow path which has an inlet and an outlet in a base made of ceramics, and a low resistance portion whose surface resistance is less than $1 \times 10^7$ Ω/sq in at least a part of the flow path.

9 Claims, 3 Drawing Sheets

(51) Int. Cl.
  *H01L 21/683* (2006.01)
  *F28F 21/04* (2006.01)
  *H01L 21/67* (2006.01)
  *F28F 3/12* (2006.01)
  *F28F 13/18* (2006.01)
  *F28D 7/04* (2006.01)

(52) U.S. Cl.
  CPC .......... *H01L 21/67109* (2013.01); *F28D 7/04* (2013.01)

(58) Field of Classification Search
  CPC .. F28F 13/02; F28F 13/06; F28F 13/08; F28F 13/12; F28F 3/12; F28F 13/18; F28F 21/04; F28F 7/04
  USPC .................................................. 165/80.4, 146
  See application file for complete search history.

(56) References Cited

U.S. PATENT DOCUMENTS

| | | | |
|---|---|---|---|
| 8,112,875 B2 | 2/2012 | Hamashima | |
| 2001/0033039 A1* | 10/2001 | Lauf | B22F 7/06 264/44 |
| 2003/0227732 A1* | 12/2003 | Dessiatoun | H01L 23/427 361/103 |
| 2004/0182544 A1* | 9/2004 | Lee | H01L 23/473 165/80.4 |
| 2006/0266498 A1* | 11/2006 | Liu | H01L 23/473 165/80.4 |
| 2007/0029740 A1 | 2/2007 | Natsuhara et al. | |
| 2007/0120095 A1* | 5/2007 | Gruner | B82Y 10/00 252/500 |
| 2010/0175853 A1* | 7/2010 | Ebert | H01L 21/4871 165/80.2 |
| 2011/0252758 A1* | 10/2011 | Babcock | B01D 46/4209 55/486 |

FOREIGN PATENT DOCUMENTS

| | | |
|---|---|---|
| JP | 2002-292920 A | 10/2002 |
| JP | 2008-016487 A | 1/2008 |
| JP | 2010-265121 A | 11/2010 |
| WO | 2006-049085 A1 | 5/2006 |
| WO | 2008-133324 A1 | 11/2008 |

OTHER PUBLICATIONS

Office Action dated Dec. 1, 2015, issued in counterpart Japanese Application No. 2014-508036.
International Search Report (Form PCT/ISA/210) dated Jun. 11, 2013 issued for PCT/JP2013/059293.

* cited by examiner

FLOW PATH MEMBER, HEAT EXCHANGER INCLUDING THE FLOW PATH MEMBER, AND SEMICONDUCTOR MANUFACTURING APPARATUS INCLUDING THE FLOW PATH MEMBER

TECHNICAL FIELD

The present invention relates to a flow path member, and a heat exchanger and a semiconductor manufacturing apparatus which include the flow path member.

BACKGROUND ART

A holding table with a flow path (hereinafter, described as a flow path member) is used to hold a wafer which is a substrate material of a semiconductor element, and heating or cooling of the wafer is performed by circulating a fluid of high or low temperature in the flow path in manufacture or inspection of the semiconductor element. Ceramics have been used as a material of the flow path member, because the ceramics allow the use of a highly corrosive gas or liquid for a fluid flowing in the flow path, have good durability and corrosion resistance, and have a good insulation property.

Here, the fluid which circulates in the flow path in the flow path member is supplied to an entrance (hereinafter, described as an inlet) of the flow path through a tube or the like; however, not a small amount of static electricity occurs due to friction between the fluid and an inner surface of the tube before the fluid is supplied to the inlet. Then, if the static electricity is discharged when the fluid charged with the static electricity flows in the flow path member from the inlet, this causes a trouble in the manufacture or inspection of a semiconductor element. Accordingly, in order to solve such a problem, it has been proposed in PTL 1 that a charge relaxation agent is added to the fluid, for example.

CITATION LIST

Patent Literature

PTL 1: Japanese Unexamined Patent Application Publication No. 2008-16487

SUMMARY OF INVENTION

Technical Problem

A problem is that if a charge relaxation agent is added to a fluid as proposed in PTL 1, static electricity caused by a circulation of the fluid can be suppressed; however, when the charge relaxation agent is alcohol as indicated in PTL 1, since alcohol is a volatile component, it is difficult to control the concentration of the charge relaxation agent in the fluid. Therefore, a flow path member which has a structure capable of suppressing the electrostatic discharge has been desired.

The present invention is devised to satisfy the above demand, and aims to provide a flow path member which can suppress electrostatic discharge and has high electrical reliability, and a heat exchanger and a semiconductor manufacturing apparatus which include the same.

Solution to Problem

A flow path member according to the present invention includes a flow path which includes an inlet and an outlet in a base made of ceramics, and a low resistance portion whose surface resistance is less than $1 \times 10^7$ Ω/sq in at least a part of the flow path.

A heat exchanger according to the present invention includes the flow path member of the above-described configuration that includes a lid portion, a partition portion, and a bottom plate portion; and a metal member provided on an upper surface or inside of the lid portion.

A semiconductor manufacturing apparatus according to the present invention includes the flow path member of the above-described configuration that includes a lid portion, a partition portion, and a bottom plate portion; and a metal member provided on an upper surface or inside of the lid portion, the metal member being an electrode for adsorbing a wafer.

Advantageous Effects of Invention

The flow path member according to the present invention includes a flow path which includes an inlet and an outlet in a base made of ceramics, and a low resistance portion whose surface resistance is less than $1 \times 10^7$ Ω/sq in at least a part of the flow path. Accordingly, even if a fluid supplied to the flow path is charged with static electricity before being supplied, the static electricity can be removed at the low resistance portion and the electrostatic discharge can be suppressed, and thereby the flow path member with high electrical reliability can be obtained.

Further, the heat exchanger according to the present invention is formed by providing a metal plate on an upper surface or inside of the lid portion of the flow path member with high electrical reliability. Accordingly, the heat exchanger with electrical reliability and high heat exchange efficiency that withstands long-term use can be obtained.

Further, the semiconductor manufacturing apparatus according to the present invention includes the flow path member with high electrical reliability. Accordingly, the semiconductor manufacturing apparatus in which a trouble does not occur in the manufacture or inspection of a semiconductor element can be obtained.

BRIEF DESCRIPTION OF DRAWINGS

FIGS. 2(a) and 2(b) illustrate an example of the flow path member of the embodiment, where

FIGS. 3(a) and 3(b) illustrate another example of the flow path member of the embodiment, where

DESCRIPTION OF EMBODIMENTS

Hereinafter, a flow path member of the present embodiment, and a heat exchanger and a semiconductor manufacturing apparatus which include the flow path member will be described.

Figure 1:
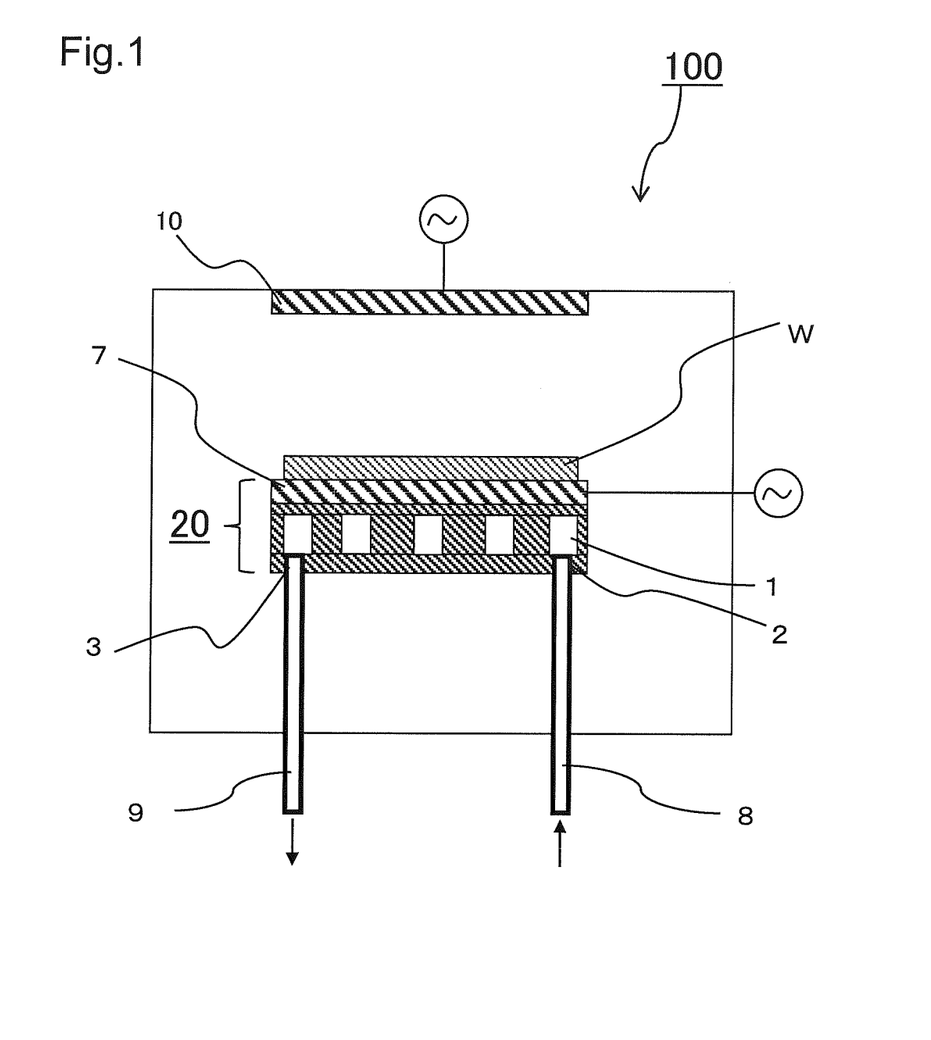
FIG. 1 is a schematic diagram illustrating an example of a semiconductor manufacturing apparatus including a flow path member of the present embodiment.

FIG. 1 is a schematic diagram illustrating an example of a semiconductor manufacturing apparatus which includes a flow path member of the present embodiment. A semiconductor manufacturing apparatus 10 is a plasma processing device for a wafer W, and the wafer W is placed on a heat exchanger 20 which includes a flow path member 1 of the embodiment and a metal member 7. In the flow path member 1, a supply tube 8 is connected to an inlet 2 and a discharge tube 9 is connected to an outlet 3, and the flow path member 1 performs heating or cooling of the wafer W by allowing a fluid of high or low temperature to circulate in a flow path in the flow path member 1.

Figure 2:
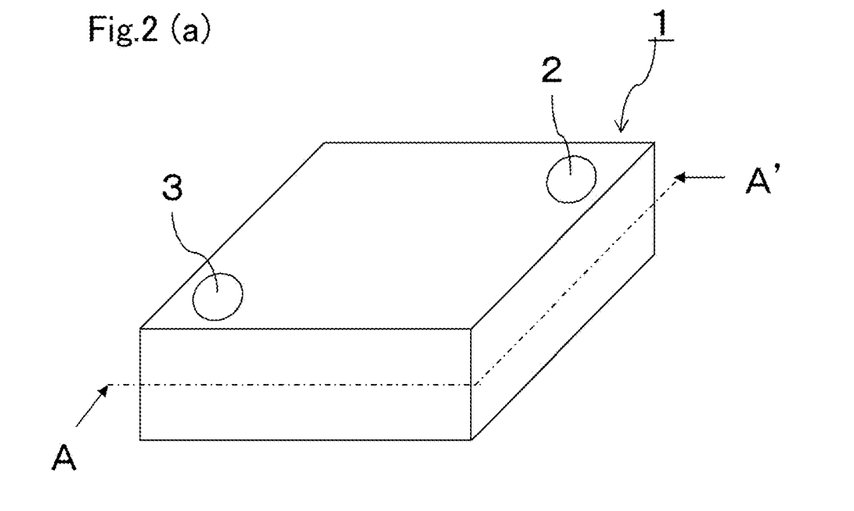
FIG. 2(a) is a perspective view.
FIG. 2(b) is a cross-sectional view taken along line A-A' of FIG. 2(a).

FIGS. 2(a) and 2(b) illustrate an example of a flow path member of the embodiment, where FIG. 2 (a) is a perspective view, and FIG. 2(b) is a cross-sectional view taken along line A-A' of FIG. 2(a). In FIG. 2(b), different colors are used so as to clearly indicate the flow path 4. Then, as illustrated in FIGS. 2(a) and 2(b), the flow path member 1 of the embodiment has the flow path 4 which includes the inlet 2 and the outlet 3 in a base made of ceramics. In addition, the flow path 4 is composed of an inflow path 4a on the inlet 2 side, an outflow path 4b on the outlet 3 side, and a circulation path 4c between the inflow path 4a and the outflow path 4b. In an example illustrated in FIG. 2B, partitions 5 are provided appropriately so that the flow path 4 becomes a meandering flow path as a whole. In the embodiment, the inflow path 4a and the outflow path 4b refer to portions corresponding to one-fifth of a total path length on the inlet side and the outlet side of the flow path 4, respectively. The inflow path 4a, the outflow path 4b, and the circulation path 4c may have widths different from each other, or may be formed to have the same width. FIG. 2 illustrates the flow path 4 in which the inflow path 4a, the outflow path 4b, and the circulation path 4c are formed to have the same width.

Here, when in use, a tube or the like which supplies or discharges a fluid is connected to the inlet 2 and the outlet 3, and when placing an object to be processed on the flow path member 1, a surface opposite to a surface on which the inlet 2 and the outlet 3 are provided is a placement surface as illustrated in FIG. 1. The tubes or the like are inserted into the inlet 2 and the outlet 3, and are connected to the inflow path 4a and the outflow path 4b by an adhesive containing a metal brazing material or a metal filler so as to improve thermal conductivity.

In addition, it is important that the flow path member 1 of the embodiment has the flow path 4 which includes the inlet 2 and the outlet 3 in the base made of ceramics, and a low resistance portion 6 whose surface resistance is less than $1\times10^7$ Ω/sq in at least a part of the flow path 4.

Here, the low resistance portion 6 whose surface resistance is less than $1\times10^7$ Ω/sq can be checked by cutting a path length of the flow path 4 in the flow path member 1 into several parts as necessary, measuring surface resistance of a surface on the flow path 4 side of the partition 5 in each cut part, and checking repeatedly whether or not there is a part whose surface resistance is less than $1\times10^7$ Ω/sq. The surface resistance can be checked by performing a measurement using a commercially available resistance measuring instrument (for example, MEGARESTA II produced by SHISHIDO ELECTROSTATIC, LTD.).

As described above, the flow path member 1 has a low resistance portion 6 whose surface resistance is less than $1\times10^7$ Ω/sq in at least a part of the flow path 4, and therefore, even if a fluid is charged with a static electricity before being supplied to the flow path member 1, the static electricity can be removed in the low resistance portion 6 and the electrostatic discharge can be suppressed. Accordingly, the flow path member 1 can have high electrical reliability. Although not illustrated in FIGS. 1 and 2, the low resistance portion 6 preferably includes an earth connected to the outside so as to remove the static electricity. As long as the earth is configured to be connected to the low resistance portion 6, any earth which does not impair the strength of the flow path member 1 and interfere with a flow of the fluid may be used.

Since a surface resistance of ceramics is generally $1\times10^7$ Ω/sq or more (for example, alumina has a surface resistance of $1\times10^{14}$ Ω/sq, and silicon carbide has a surface resistance of $1\times10^7$ Ω/sq), if the low resistance portion 6 has a surface resistance of less than $1\times10^7$ Ω/sq, it is possible to efficiently remove static electricity in a fluid.

Moreover, since the base is made of ceramics and has durability and corrosion resistance, a highly corrosive gas or liquid can be used for a fluid flowing in the flow path 4, and since the base is an insulating member in electric characteristics, the flow path member 1 can be good in insulation properties. As a material of the flow path member 1, it is possible to use alumina, zirconia, silicon nitride, aluminum nitride, silicon carbide, boron carbide, cordierite, or a combination of these.

In addition, in the flow path member 1 of the embodiment, it is preferable that the flow path 4 include the inflow path 4a on an inlet side, the outflow path 4b on an outlet side, and the circulation path 4c between the inflow path 4a and the outflow path 4b, and include a low resistance portion 6 in the inflow path 4a. As described above, when the low resistance portion 6 is included in the inflow path 4a, even if a fluid is charged with a static electricity before being supplied to the flow path member 1, the static electricity can be removed in the low resistance portion 6 in the inflow path 4a with which the fluid first contacts in the base, so that the electrostatic discharge can be suppressed in the flow path of the flow path member 1 and the flow path member 1 can have high electrical reliability.

In order to efficiently suppress electrostatic discharge, it is preferable that the inlet 2 constitute a part of the low resistance portion 6. With such a configuration, it is possible to efficiently remove static electricity in the inlet 2 that is a portion with which the fluid supplied to the flow path member 1 first contacts.

In the case of having the above-described configuration, when connecting the tube and the inflow path 4a using an adhesive containing a metal brazing material or a metal filler as described above, static electricity may be removed by connecting the connection portion to an earth.

Moreover, when the earth is connected to the inlet 2 in the flow path member 1 of the embodiment, it is preferable that a surface resistance of the low resistance portion 6 of the inflow path 4a decrease stepwise towards the inlet 2. The surface resistance of the low resistance portion 6 of the inflow path 4a decreases stepwise towards the inlet 2, and thereby static electricity generated by friction between the inflow path 4a and the fluid flowing in the inflow path 4a can easily flow in a direction towards the inlet 2 that is a direction in which the surface resistance decreases stepwise, and be easily removed through the earth. Accordingly, it is possible to further reduce the possibility that the static electricity is discharged, and to further increase electrical reliability. A comparison between surface resistances in the inflow path 4a is performed by dividing a path length of the inflow path 4a into five equal parts, measuring a surface resistance of each part, and comparing the results with each other. The surface resistance is desired to decrease stepwise towards the inlet 2 side from a part which is the farthest from the inlet 2 in the low resistance portion 6.

The surface resistance may decrease stepwise towards the inlet 2 and the outlet 3, and may decrease continuously (gradually). "Stepwise" is used below as having the same meaning.

In addition, it is preferable that the flow path member 1 of the embodiment have a low resistance portion 6 in the outflow path 4b. If the low resistance portion 6 is included also in the outflow path 4b as described above, it is possible to remove static electricity generated by friction between the fluid and the flow path 4 in the flow path member 1 even at the outflow path 4b side. Accordingly, an opportunity to remove the static electricity is increased, and it is possible to suppress electrostatic charge in the fluid.

In this case, it is preferable that the outlet 3 constitute a part of the low resistance portion 6 in the same manner as the low resistance portion 6 in the inflow path 4a. In this case, when connecting a tube and the outflow path 4b using an adhesive containing a metal brazing material or a metal filler, the connection portion may be connected to an earth.

Moreover, when the earth is connected to the outlet 3 in the flow path member 1 of the embodiment, it is preferable that the surface resistance of the low resistance portion 6 of the outflow path 4b decrease stepwise towards the outlet 3. The surface resistance of the low resistance portion 6 of the outflow path 4b decreases stepwise towards the outlet 3, and thereby static electricity caused by friction between the outflow path 4b and a fluid flowing in the outflow path 4b can easily flow in a direction towards the outlet 3 that is a direction in which the surface resistance decreases stepwise, and be easily removed through the earth. Accordingly, the electrostatic charge in the fluid is easily removed even at the outlet 3. A comparison between surface resistances in the outflow path 4b is performed by dividing a path length of the outflow path 4b into five equal parts, measuring a surface resistance of each part, and comparing the results with each other. The surface resistance is desired to decrease stepwise towards the outlet 3 side from a part which is the farthest from the outlet 3 in the low resistance portion 6.

In addition, it is preferable that the base of the flow path member 1 of the embodiment be made of a silicon carbide sintered body. When the flow path member 1 of the embodiment is made of a silicon carbide sintered body, the flow path member has a high thermal conductivity in addition to good mechanical properties and corrosion resistance, and thus a heat exchange efficiency is improved. Moreover, since the silicon carbide sintered body has a smaller specific gravity compared to other ceramics such as alumina, it is possible to reduce the weight and to reduce loads in transportation or the like when the flow path member is made in a large size.

A material of the flow path member 1 can be checked by cutting out a sample of a certain size from the flow path member 1 and performing an X-ray diffraction method. Moreover, the content of the material can be checked by performing an energy dispersive X-ray (EDS) analysis using a scanning electron microscope (SEM). In addition, the content can also be checked by an ICP emission spectrometry or an X-ray fluorescence analysis.

In addition, there is a case where a pressure of a fluid is increased so as to increase the heat exchange efficiency of the flow path member 1. As a result, however, a large pressure may be applied to the vicinity of the inlet 2 to which a tube is connected, a crack may occur in the vicinity of the inlet 2, and the inflow path 4a may be damaged due to the occurrence of the crack.

Therefore, it is preferable that the content of carbon in a surface of the inflow path 4a increase stepwise towards the inlet 2 in the flow path member 1 of the embodiment. Since carbon has relatively low hardness, the carbon functions as a cushion against a pressure applied to the flow path, and thereby it is possible to reduce a possibility that a crack or damage occurs. Therefore, the content of carbon increases towards the inlet 2 to which a particularly large pressure is applied, and thereby it is possible to suppress occurrence of a crack in the vicinity of the inlet 2, and to suppress damage to the inflow path 4a.

On the other hand, when a fluid with a high pressure flows in through the inlet 2, the fluid with a high pressure also flows on the outlet 3 side. Therefore, in this case also, a large pressure may be applied to the vicinity of the outlet 3 to which a tube is connected, a crack may occur in the vicinity of the outlet 3, and the outflow path 4b may be damaged due to the occurrence of the crack.

Therefore, it is preferable that the content of carbon in a surface of the outflow path 4b increase stepwise towards the outlet 3 in the flow path member 1 of the embodiment. Since carbon has relatively low hardness as described above, the carbon functions as a cushion against a pressure applied to the flow path, and thereby it is possible to reduce a possibility that a crack or damage occurs. Therefore, the content of carbon increases towards the outlet 3 to which a particularly large pressure is applied, and thereby it is possible to suppress occurrence of a crack in the vicinity of the outlet 3, and to suppress damage to the outflow path 4b.

Here, the content of composition in each of the inflow path 4a and the outflow path 4b of the flow path member 1 can be checked by performing the energy dispersive X-ray (EDS) analysis using the scanning electron microscope (SEM). In addition, the content can also be checked by the ICP emission spectrometry or the X-ray fluorescence analysis (XRF).

Figure 3:
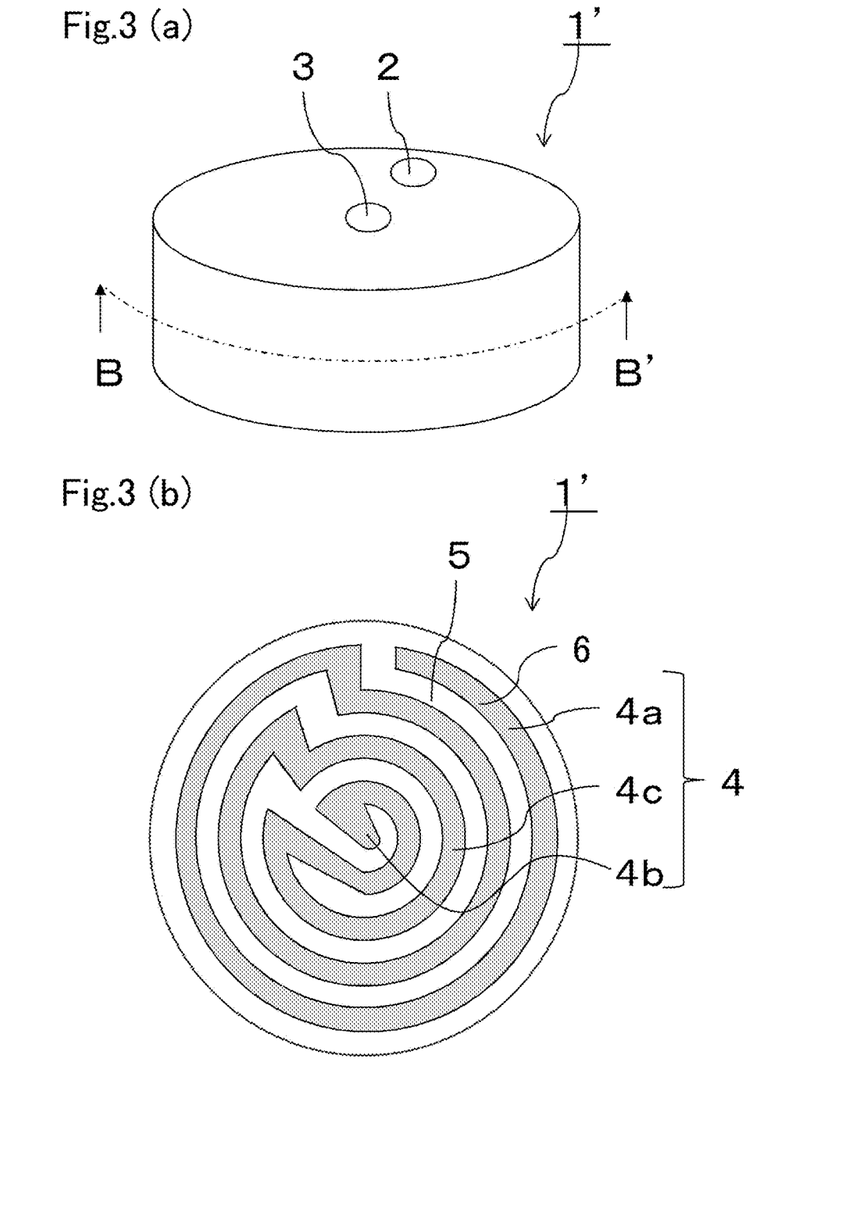
FIG. 3(a) is a perspective view.
FIG. 3(b) is a cross-sectional view taken along line B-B' of FIG. 3(a).

FIGS. 3(*a*) and 3(*b*) illustrate another example of the flow path member of the embodiment, where FIG. 3(*a*) is a perspective view, and FIG. 3(*b*) is a cross-sectional view taken along line B-B' of FIG. 3(*a*). In FIG. 3(*b*), different colors are used so as to clearly indicate the flow path 4 in the same manner as in FIG. 2(*b*).

As described above, the flow path member 1 may be in a cylindrical shape as illustrated in FIG. 3. In this case, the inlet 2 is positioned on an end side of the flow path member 1 and the outlet 3 is positioned at a center thereof, and the flow path 4 is formed to be spiral-shaped, and thereby it is possible to achieve a uniform temperature in the flow path member 1.

Moreover, the inlet 2 and the outlet 3 may be provided close to each other, and the flow path 4 may be formed to have a shape in which a way of winding a spiral from a fluid entry side is made to be different from a way of winding a spiral towards a fluid exit side, and thereby it is possible to achieve a more uniform temperature of the flow path member 1.

As described above, FIGS. 2 and 3 illustrate the examples in which both the inlet 2 and the outlet 3 are provided on one main surface which is an illustrated surface; however, it is needless to say that the inlet 2 and the outlet 3 may be provided on a side surface, or the position of the inlet 2 and the position of the outlet 3 may be changed to each other in FIG. 3.

Furthermore, in the heat exchanger 20 of the embodiment, it is preferable that the flow path member 1 of the embodiment have a lid portion, a partition portion, and a bottom plate portion, and a metal member 7 be provided on an upper surface or inside of the lid portion. Since the metal member is provided on the upper surface or inside of the lid portion, the heat exchanger 20 can have electrical reliability and high heat exchange efficiency, and withstands a long-term use. Moreover, it is possible to perform heating by allowing a current to flow in the metal member 7 to adjust the temperature of a fluid.

In addition, even though not illustrated, a dielectric layer is provided between the metal member 7 and the wafer W in a semiconductor device 100 including the heat exchanger 20 described above. When a voltage is applied to the metal member 7, an electrostatic attraction force such as Coulomb force, Johnson-Rahbek force, or the like is generated between the wafer W and the dielectric layer, thereby adsorbing and holding the wafer W. When using the semiconductor manufacturing apparatus 100 as a plasma processing device, the metal member 7 of the heat exchanger 20 can also be used as a lower electrode for generating plasma, and the plasma can be generated between the electrode 7 and an antenna electrode 10 which is provided in an upper portion of a processing chamber by applying a voltage between the electrodes 7 and 10, thereby applying the plasma onto the wafer W which is adsorbed and held on the dielectric layer. Then, the lower electrode which reaches a high temperature during plasma processing is cooled down to be maintained at a stable temperature by allowing a fluid to flow in the flow path member 1 through the inlet 2 using the supply tube 8, and discharging the fluid from the discharge tube 9 through the outlet 3. Accordingly, since a temperature of the wafer W is also controlled, processing with a high dimensional accuracy can be performed. Moreover, the metal member 7 of the semiconductor manufacturing apparatus 100 may be divided into multiple parts, and may be used as a bipolar electrode consisting of one electrode and the other electrode. Furthermore, when a side on which the wafer W is placed in the flow path member 1 is set to be a lid portion, the metal member 7 may be provided in the lid portion.

Since the flow path member 1 of the embodiment has good durability and corrosion resistance, and has high electrical reliability as described above, the semiconductor manufacturing apparatus 100 of the embodiment including the flow path member is a suitable semiconductor manufacturing apparatus that causes less troubles in the manufacture or inspection of a semiconductor element. Moreover, as the semiconductor manufacturing apparatus 100 of the embodiment, there are a sputtering apparatus, a resist coating apparatus, a CVD apparatus, and the like, or an etching apparatus in addition to the plasma processing apparatus of FIG. 1 illustrating an example of the semiconductor manufacturing apparatus, and it is possible to obtain the effects described above by including the flow path member 1 of the embodiment in these apparatuses.

Hereinafter, an example of a method of manufacturing the flow path member 1 of the embodiment will be described.

First, in the production of the flow path member 1, a process of obtaining a molded body of a lid portion and a base portion which includes a recess portion that is to be the flow path 4 including a partition portion and a bottom plate portion will be described. A primary raw material is made by preparing a ceramic raw material whose purity is 90% or more and whose average particle size is about 1 μm, and by spray-drying a slurry, which is obtained by adding a certain amount of sintering aids, binder, solvent, dispersant, and the like to the prepared ceramic raw material and mixing them, according to a spray granulation method (spray-drying method) and granulating the slurry. Next, the primary raw material which is spray-dried and granulated is put into a rubber mold of a certain shape, molded by an isostatic pressing method (rubber press method), and then the molded body is removed from the rubber mold to be subjected to a cutting.

In this cutting, a molded body to be the lid portion is formed to have a desired outer shape, and the inlet 2 and the outlet 3 are formed therein. A molded body to be the base portion is formed to have a desired outer shape, and the recess portion to be the flow path 4 is formed therein. Then, a portion corresponding to a low resistance portion 6 in each of the molded body to be the lid portion and the molded body to be the base portion is coated with a conductive component.

Examples of the conductive component include a component whose surface resistance is lower than ceramics constituting the base portion described above, and copper, carbon (graphite), or the like can be exemplified as an example. For example, a surface resistance of copper is $10^{-5}$ Ω/sq, and a surface resistance of carbon (graphite) is $10^{-4}$ Ω/sq. By coating such conductive component, it is possible to provide a low resistance portion 6 whose surface resistance is less than $1 \times 10^7$ Ω/sq in at least a part of the flow path.

If the low resistance portion 6 is provided in the flow path 4 of the flow path member 1, particularly near a center of a path length of the flow path 4, it is possible to remove static electricity to the outside and to obtain the effects of the embodiment by processing a hole from an outer side of the flow path member 1 towards the low resistance portion 6 and embedding a conductor into the hole. The processed hole may have a size so as to contact with at least a part of the low resistance portion 6 in the flow path 4.

The conductive component can be checked by cutting out a sample of a certain size from the low resistance portion 6 and performing an X-ray photoelectron spectroscopy (XPS) analysis.

Next, a process of bonding the molded body to be the lid portion and the molded body to be the base portion will be described. As a bonding agent which is used in bonding, a bonding agent, which is made of a slurry used in producing the molded body to be the lid portion and the molded body to be the base portion and obtained by weighing a certain amount of a ceramic raw material, sintering aids, binder, dispersant, and solvent and mixing them, is used. Then, a bonded molded body is obtained by coating a bonded portion of at least one of the molded body to be the lid portion and the molded body to be the base portion with the bonding agent, and integrating the molded body to be the lid portion and the molded body to be the base portion. Then, it is possible to obtain the flow path member 1 of the embodiment by firing the bonded molded body in an atmosphere of a temperature corresponding to the ceramic raw material.

In addition, as another example of the manufacturing method, the molded body to be the lid portion and the molded body to be a base portion are fired in an atmosphere of a temperature corresponding to the ceramic raw material, thereby obtaining sintered bodies of the lid portion and the base portion. Then, a conductive component is deposited at a portion corresponding to a low resistance portion 6 in each sintered body of the lid portion and the base portion by a vapor deposition method or a liquid phase deposition method. Here, as the vapor deposition method, evaporation methods such as an ion plating method, an electron beam method, a resistance heating method, and the like or a sputtering method are exemplified. Moreover, as the liquid phase deposition method, for example, a coating method, a plating method, and the like are exemplified. Then, using a bonding agent made of glass, it is possible to obtain the flow path member 1 of the embodiment by coating a bonded portion of at least one sintered body of the lid portion and the base portion with the bonding agent to be integrated, and by performing heat processing.

In addition, as another example of the process to obtain the molded body, green sheets may be formed by a doctor blade method or a roll compaction molding method which is a general molding method of ceramics using a slurry, and may be stacked to each other using molded bodies that are punched to a desired shape by a die.

As a method of producing the slurry, for example, when the base is made of a silicon carbide sintered body, silicon carbide powder whose average particle size is 0.5 µm or more and 2 µm or less, and powder of boron carbide and carboxylate as sintering aids are prepared. Then, each powder is weighed and mixed so that boron carbide powder is 0.12 mass % or more and 1.4 mass % or less and carboxylate powder is 1 mass % or more and 3.4 mass % or less with respect to 100 mass % of silicon carbide powder.

Then, together with the mixed powder, a binder such as polyvinyl alcohol, polyethylene glycol, acrylic resin, butyral resin, or the like, water, and dispersant are put in a ball mill, a tumbling mill, a vibration mill, a bead mill, or the like to be mixed. Here, an added amount of the binder may be determined so that strength and flexibility of the molded body is good, and degreasing of a binder for a molding during firing is not insufficient, and slurry produced in this manner may be used.

Using the slurry produced in this manner, it is possible to obtain green sheets by performing a known doctor blade method, or by performing a roll compaction molding method on a primary raw material which is made by spray-drying and granulating the slurry with the spray granulation method (spray-drying method).

A plurality of green sheets produced in this manner are stacked to each other so as to be a desired shape. However, green sheets whose respective dimensions are adjusted and processed by a die or a laser in advance may be stacked, and a thickness of respective green sheets may be changed or the number of the stacked green sheets may be changed when necessary. Accordingly, it is possible to easily form the flow path 4. At this time, as a bonding agent to be used in stacking the green sheets, a bonding agent, which is made of slurry used in producing the green sheets and obtained by weighing and mixing a certain amount of a ceramic raw material, sintering aids, a binder, a dispersant, and a solvent is used. A molded body can be obtained by stacking the green sheets coated with the bonding agent, applying a pressure of about 0.5 MPa to the stacked green sheets through a pressurizing tool of a flat plate shape, and then drying at a room temperature of about 50° C. to 70° C. for 10 hours to 15 hours.

Then, a molded body to be the flow path member 1 is fired in a continuous tunnel furnace in, for example, a known pusher method or a roller method. Firing temperature varies depending on each material; however, for example, a material of silicon carbide may be held within a temperature range between 1800° C. to 2200° C. for 10 minutes to 10 hours, and then may be fired within a temperature range between 2200° C. to 2350° C. for 10 minutes to 20 hours in an atmosphere of inert gas or a vacuum atmosphere. As a method of forming a low resistance portion 6, the inside of the flow path 4 may be coated with a conductive component such as copper, carbon (graphite), or the like through the inlet 2 and the outlet 3.

Moreover, in order to decrease stepwise a surface resistance of a low resistance portion 6 of the inflow path 4a towards the inlet 2, or to decrease stepwise a surface resistance of a low resistance portion 6 of the outflow path 4b towards the outlet 3, in a coating or a deposition of the conductive component, production may be performed by increasing stepwise the content of the conductive component towards the inlet 2 in the inflow path 4a or towards the outlet 3 in the outflow path 4b.

Even if a fluid is charged with static electricity before being supplied, the flow path member 1 of the embodiment obtained in this manner has a low resistance portion 6 whose surface resistance is less than $1 \times 10^7$ Ω/sq in at least a part of the flow path 4, so that it is possible to suppress the possibility that the static electricity is discharged, and the flow path member can have high electrical reliability. Moreover, in particular, the semiconductor manufacturing apparatus includes the flow path member 1 of the embodiment, thereby performing the manufacture or inspection of a semiconductor element without causing a trouble.

Hereinafter, examples of the embodiment will be described in detail; however, the embodiment is not limited to the examples below.

EXAMPLE 1

Using the semiconductor manufacturing apparatus which includes the flow path member of the embodiment illustrated in FIG. 1, a test on whether the static electricity of a fluid caused by circulating the fluid is removed or not was performed.

The flow path member used at this time was the flow path member illustrated in FIG. 2, and a manufacturing of the flow path member was performed by preparing silicon carbide powder whose average particle size is 1.25 µm, and powder of boron carbide and carboxylate as sintering aids, and then by weighing and mixing each powder so that boron carbide powder is 0.76 mass % and carboxylate powder is 2.2 mass % with respect to 100 mass % of silicon carbide powder.

Then, together with the mixed powder, polyvinyl alcohol as a binder, water, and a dispersing agent were put into a ball mill and were mixed to produce slurry.

Then, a molded body was obtained by using the obtained slurry to produce a plurality of green sheets by a well-known doctor blade method, stacking the green sheets obtained by performing laser processing on portions to be the inlet 2, the outlet 3, and the flow path onto a part of the green sheets, applying a pressure of about 0.5 MPa to the stacked green sheets through a pressurizing tool of a flat plate shape, and then drying the stacked green sheets at a room temperature of 70° C. for 13 hours. Between respective green sheets stacked on each other, the slurry which is used when producing the green sheets was used as an adhesive.

Subsequently, the flow path member was obtained by holding the molded body at a temperature of 2000° C. in an atmosphere of inert gas for five hours, and then firing the molded body at a temperature of 2275° C. for ten hours.

As a sample, a flow path member in which the inflow path 4a is coated with carbon so as to be connected to the inlet 2 through the inlet 2 to form a low resistance portion 6 was set to be Sample No. 1 of the embodiment, and as a comparative sample of the embodiment, a flow path member in which the low resistance portion 6 is not formed was set to be Sample No. 2. A surface resistance was measured by using a MEGARESTA II produced by SHISHIDO ELECTROSTATIC, LTD., the surface resistance of a low resistance portion 6 was $1 \times 10^6$ Ω/sq, and the surface resistance of the other locations of the flow path was $1 \times 10^7$ Ω/sq.

Then, a test on whether static electricity is removed or not was performed by setting each obtained sample in the semiconductor manufacturing apparatus 100 illustrated in FIG. 1 and circulating fluid made of a fluorine cooling medium.

The supply tube 8 and the discharge tube 9 used at this time were made of rubber, had portions to be connected to the inlet 2 and the outlet 3 wrapped with a metal film, and were bonded to the inlet 2 and the outlet 3, respectively, using a metal blazing material. In only Sample No. 1, an earth was installed at the portion of the inlet 2 to be bonded using the metal blazing material so as to remove static electricity, but the earth was not provided in Sample No. 2.

Next, as a method of checking whether or not static electricity is removed, a current value of the metal blazing material of the inlet 2 was measured every five minutes while circulating a fluid for 60 minutes. If the current value was constant, the static electricity was considered to be removed, and if the current value gradually increased, the static electricity was considered not to be removed. The current value at this time was measured using a tester (produced by Ohm Electric Inc. standard TAR-501).

As a result of measuring the current value every five minutes for 60 minutes, it was found that the current value was constant in Sample No. 1 of the present embodiment in which a low resistance portion 6 of the example was provided, but the current value gradually increased in Sample No. 2 of the comparative example.

REFERENCE SIGNS LIST

1, 1' flow path member
2 inlet
3 outlet
4 flow path
4a inflow path
4b outflow path
4c circulation path
100 semiconductor manufacturing apparatus

The invention claimed is:

1. A flow path member comprising:
 a base comprising an outer surface; and
 a flow path in the base comprising
  an inlet,
  an outlet,
  an inflow path on an inlet side of the flow path, the inflow path defining a first portion of the flow path whose surface resistance is less than $1 \times 10^7$ Ω, the surface resistance of the inflow path decreasing stepwise from a downstream end of the inflow path to an upstream end of the inflow path, and
  an outflow path on an outlet side of the flow path.

2. The flow path member according to claim 1, wherein the outflow path defines a second portion of the flow path having a surface resistance of less than $1 \times 10^7$ Ω.

3. The flow path member according to claim 2, wherein the surface resistance of the outflow path decreases stepwise from an upstream end of the outflow path to a downstream end of the outflow path.

4. The flow path member according to claim 1, wherein the base is made of a silicon carbide sintered body.

5. The flow path member according to claim 4, wherein carbon exists in a surface of the inflow path, and a content of carbon increases stepwise from a downstream end of the inflow path to an upstream end of the inflow path.

6. The flow path member according to claim 4, wherein carbon exists in a surface of the outflow path, and a content of carbon increases stepwise from an upstream end of the outflow path to a downstream end of the outflow path.

7. A heat exchanger comprising the flow path member according to claim 1 that includes a lid portion, a partition portion, and a bottom plate portion; and a metal member provided on an upper surface or inside of the lid portion.

8. A semiconductor manufacturing apparatus comprising the flow path member according to claim 1 that includes a lid portion, a partition portion, and a bottom plate portion; and a metal member provided on an upper surface or inside of the lid portion, the metal member being an electrode for adsorbing a wafer.

9. The flow path member according to claim 1, wherein the flow path further comprises a circulation path between the inflow path and the outflow path.

* * * * *